(12) United States Patent
Takeuchi et al.

(10) Patent No.: US 8,872,421 B2
(45) Date of Patent: Oct. 28, 2014

(54) WHITE LED, BACKLIGHT USING THE SAME, AND LIQUID CRYSTAL DISPLAY DEVICE

(75) Inventors: Hajime Takeuchi, Yokohama (JP); Ryo Sakai, Yokohama (JP); Tsutomu Ishii, Yokohama (JP); Yasumasa Ooya, Chigasaki (JP); Yasuhiro Shirakawa, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 141 days.

(21) Appl. No.: 13/407,942

(22) Filed: Feb. 29, 2012

(65) Prior Publication Data
US 2012/0206671 A1  Aug. 16, 2012

Related U.S. Application Data

(63) Continuation of application No. PCT/JP2010/005199, filed on Aug. 24, 2010.

(30) Foreign Application Priority Data

Sep. 2, 2009 (JP) ................ P2009-202899

(51) Int. Cl.
*H01J 1/62* (2006.01)
*H01J 63/04* (2006.01)
*G02F 1/1335* (2006.01)
*H01J 1/63* (2006.01)
*H01L 33/50* (2010.01)
*H01L 33/60* (2010.01)

(52) U.S. Cl.
CPC ............ *G02F 1/133603* (2013.01); *H01J 1/63* (2013.01); *H01L 33/504* (2013.01); *H01L 33/60* (2013.01)

USPC .......... 313/501; 313/483; 313/500; 313/502; 313/503; 313/504; 313/505; 313/506

(58) Field of Classification Search
None
See application file for complete search history.

(56) References Cited

U.S. PATENT DOCUMENTS 6,252,254 B1   6/2001 Soules et al.
7,271,423 B2 * 9/2007 Hanamoto et al. .............. 257/98

(Continued)

FOREIGN PATENT DOCUMENTS

JP    2000-73052       3/2000
JP    2002-076445 A    3/2002

(Continued)

OTHER PUBLICATIONS

International Search Report mailed Oct. 19, 2010 in PCT/JP2010/005199 filed Aug. 24, 2010 (in English).

(Continued)

*Primary Examiner* — Natalie Walford
(74) *Attorney, Agent, or Firm* — Oblon, Spivak, McClelland, Maier & Neustadt, L.L.P.

(57) ABSTRACT

Certain embodiments provide a white LED for a backlight of a liquid crystal display device, which comprises an ultraviolet (or violet) light emitting element and a phosphor layer that contains a green phosphor selected from trivalent cerium- and terbium-activated rare earth borate phosphors, a blue phosphor selected from divalent europium-activated halophosphate phosphors and divalent europium-activated aluminate phosphors, and a red phosphor selected from europium-activated lanthanum oxysulfide phosphors and europium-activated yttrium oxysulfide phosphors as the contained amounts of the respective phosphors relative to the total amount of the phosphors as follows: 35-50% by weight of the green phosphor content; 50-70% by weight of the blue phosphor content; and 1-10% by weight of the red phosphor content.

20 Claims, 3 Drawing Sheets

(56) References Cited

U.S. PATENT DOCUMENTS

2002/0063301 A1     5/2002    Hanamoto et al.
2009/0166652 A1     7/2009    Sakai et al.

FOREIGN PATENT DOCUMENTS

| | | |
|---|---|---|
| JP | 2005-322674 | 11/2005 |
| JP | 2007-274009 | 10/2007 |
| JP | 2008-218486 | 9/2008 |
| JP | 2009-035673 A | 2/2009 |
| WO | WO 2006/118104 A1 | 11/2006 |

OTHER PUBLICATIONS

International Written Opinion mailed Oct. 19, 2010 in PCT/JP2010/005199 filed Aug. 24, 2010.

International Preliminary Report on Patentability and Written Opinion issued Apr. 19, 2012 and Oct. 19, 2010 respectively in Application No. PCT/JP2010/005199 (English Translation).

Office Action mailed May 7, 2014 in Japanese Patent Application No. 2011-529783 (with English Translation).

* cited by examiner

WHITE LED, BACKLIGHT USING THE SAME, AND LIQUID CRYSTAL DISPLAY DEVICE

CROSS-REFERENCE TO RELATED APPLICATIONS

This application is a continuation of prior International Application No. PCT/JP2010/005199, filed on Aug. 24, 2010 which is based upon and claims the benefit of priority from Japanese Patent Application No. 2009-202899 filed on Sep. 2, 2009; the entire contents of all of which are incorporated herein by reference.

FIELD

Embodiments described herein relate generally to a white LED suitable for a backlight of a liquid crystal display device and the like, and a backlight using it and a liquid crystal display device.

BACKGROUND

Recently, it has come to develop a white LED having characteristics such as compactness, long life, low-voltage drive, mercury free and the like in contract to a fluorescent tube (FL) and a cold cathode fluorescent lamp (CCFL) which are excited by mercury gas and used for general lighting, a backlight of the liquid crystal display device, and the like.

The white LED includes type 1 that combines three-color light emitting diodes such as a red light emitting diode, a green light emitting diode and a blue light emitting diode to emit white light, and type 2 that combines a light emitting diode having long-wavelength ultraviolet light (300 to 430 nm) or a blue wavelength (460 to 480 nm) as an excitation source with a phosphor layer which contains a plurality of types of visible light emitting phosphors to emit white light.

Since the type 1 uses a three-color light source, a mechanism for color mixing, such as use of a diffuser plate for producing white light or provision of a space for diffusion, is required, so that a thickness is needed for the backlight. And, since three types of LEDs are used, the number of parts increases because separate control circuits are required for them, and there is a problem in view of the cost.

Since the type 2 can use the same LED for all and emits the same color by them, a mechanism for mixing colors is not needed, and the control circuit is only one type, so that the number of parts can be reduced, and it can be produced inexpensively in view of the cost. The white LED of the type 2 includes one using the long-wavelength ultraviolet (or violet) light emitting diode as described above and one using the light emitting diode which emits blue light (460 to 480 nm).

In a case where an ultraviolet (or violet) light emitting diode is used, visible light emitting phosphors of three colors of red, green and blue are used as the phosphor layer to obtain white light. On the other hand, the blue light emitting diode generally obtains the white light by using visible light emitting phosphors of two colors of red and yellow. It has come to know that when the ultraviolet light emitting diode is used, color reproducibility is better because three color phosphors are used in comparison with the blue light emitting diode which uses two colors to obtain white light.

Different from conventional excitation by mercury gas at 254 nm, the type 2 white LED is excited with long-wavelength ultraviolet light (300 to 430 nm) or a blue wavelength (460 to 480 nm) and, therefore, cannot often use the phosphor which has been used for the present FL and CCFL.

Especially, $LaPO_4$:Ce, Tb which is generally used as a green phosphor for the FL and CCFL hardly emits light at 320 to 430 nm. Therefore, it is well known that as a green component, $BaMgAl_{10}O_{17}$:Eu, Mn is used (component satisfying the general formula), but there was a problem that the color rendering properties were deteriorated when used for lighting because as the green component, an emission wavelength is 515 nm, which is a short wavelength in comparison with 543 nm of the conventional material $LaPO_4$:Ce, Tb, and doesn't become complete interchangeable.

On the other hand, the liquid crystal display device has its color reproducibility range determined as a display device depending on a combination of the backlight and the color filter. For example, even when the CCFL is merely replaced by the white LED in a liquid crystal display device which has a backlight using CCFL mounted, the properties of the liquid crystal display device are not improved. It is because the color filter is designed in conformity with the color reproduction region of the light of the CCFL. In other words, mere replacement of the light source from the CCFL to the white LED does not necessarily improve the properties of the liquid crystal display device.

For example, a certain reference discloses a white LED using $YBO_3$:$Ce^{3+}$, $Tb^{3+}$ phosphors (cerium- and terbium-activated yttrium borate phosphors) as a green phosphor, and $Y_2O_2S$:$Eu^{3+}$, $Bi^{3+}$ phosphors (europium- and bismuth-activated yttrium oxysulfide phosphors) as a red phosphor. But, since a blue light emitting diode is used in the reference, the color reproduction region of the blue portion is particularly fixed by the light emitting property of the blue light emitting diode. Therefore, since the color reproduction region is different from the CCFL, it is necessary to change the design of the color filter to use the white LED of the reference for the liquid crystal display device using the conventional CCFL.

Therefore, there were demands for the white LED having the same color reproduction region as that of the conventional FL or CCFL by using the light emitting diode which has good color reproducibility, namely which can adjust the color reproduction region in a large range and emits light with long-wavelength ultraviolet light (300 to 430 nm). And, in response to the above demands, there is disclosed a white LED which is characterized by three color phosphors of red, green and blue to be combined with an ultraviolet (or violet) light emitting element.

Recent liquid crystal display devices are used for various types of screens (monitors) such as small screens of cellular phones, car navigation systems and mobile telecommunications equipment, middle- and large-size screens of personal computers and TVs, and CCFL is mainly used for their backlight light source.

To use the CCFL as the light source, there are proposed conventionally various types of optical members such as color filters and the like to make the light from the CCFL better and to improve the color reproducibility. Considering the characteristics and the like of the emitted light of the CCFL, such a color filter is designed to provide the best display quality, color reproducibility and the like in specific uses, and there are also provided many satisfactory color filters for the CCFL at present.

Recently, attempts have been made to use the LED instead of the CCFL as the light source in response to increasing demands for mercury free in view of environmental problems, but since the conventional white LED is largely different in emission color from the CCFL, mere replacement of the CCFL of the liquid crystal display device with the white LED cannot provide good display quality and color reproducibility, and the color filter designed to be suitable for the CCFL cannot be used.

Under the above circumstances, to use a conventional white LED as a light source, the color filter was also required to be redesigned so as to be suitable for the emitted light characteristics or a color reproduction region of the white LED. It is needless to say that significant cost and time are needed to develop a technology to design a new color filter and to produce it stably. Thus, it is demanded to develop a white LED that a conventional CCFL color filter can be used as it is.

DETAILED DESCRIPTION

Figure 1:
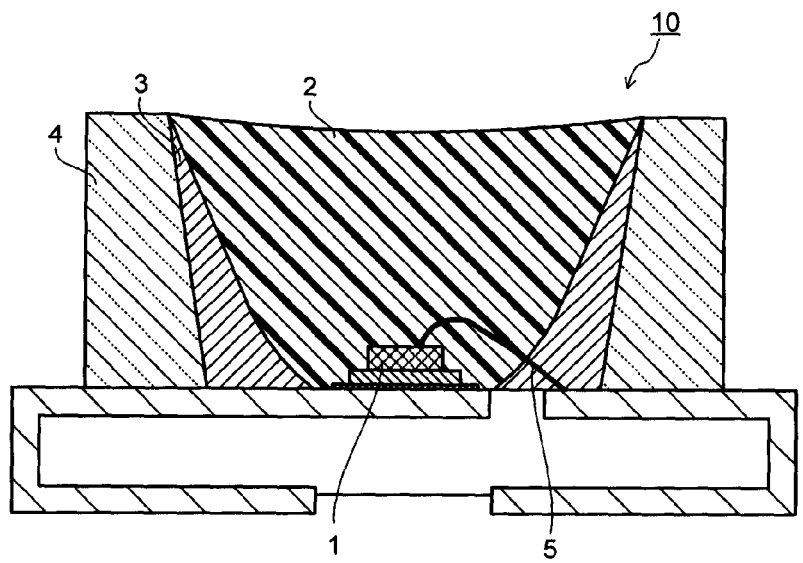
FIG. 1 is a sectional view showing an example of the white LED of an embodiment.

The white LED of a first mode of the embodiment is a white LED for a backlight of a liquid crystal display device, comprising at least one light emitting element selected from ultraviolet light emitting diodes, violet light emitting diodes, ultraviolet light emitting lasers and violet light emitting lasers, and a phosphor layer, wherein an emission spectrum of the white LED has a first emission peak group comprising at least one emission peak having a maximum intensity in a range of 430 to 470 nm, a second emission peak group having at least one line emission peak having a maximum intensity in a range of 470 to 560 nm, and a third emission peak group having at least one line emission peak having a maximum intensity in a range of 600 to 650 nm, and when maximum intensity P1 of the first emission peak group is determined to be 1, maximum intensity P2 of the second emission peak group is $3 \leq P2 \leq 5$, and maximum intensity P3 of the third emission peak group is $1 \leq P3 \leq 5$.

The white LED of a second mode of the embodiment is a white LED for a backlight of a liquid crystal display device, comprising at least one light emitting element selected from ultraviolet light emitting diodes, violet light emitting diodes, ultraviolet light emitting lasers and violet light emitting lasers, and a phosphor layer containing a green phosphor, a blue phosphor and a red phosphor, wherein the green phosphor is at least one phosphor selected from trivalent cerium- and terbium-activated rare earth borate phosphors substantially represented by the following general formula 1; the blue phosphor is at least one phosphor selected from divalent europium-activated halophosphate phosphors substantially represented by the following general formula 2 and divalent europium-activated aluminate phosphors substantially represented by the following general formula 3; the red phosphor is at least one phosphor selected from europium-activated lanthanum oxysulfide phosphors represented by the following general formula 4 and europium-activated yttrium oxysulfide phosphors represented by the following general formula 5; and the contained amounts of the respective color phosphors in the phosphor layer relative to the total amount of the phosphors are as follows: 35 to 50% by weight of the green phosphor, 50 to 70% by weight of the blue phosphor, and 1 to 10% by weight of the red phosphor:

<green phosphor>

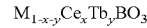

general formula 1

(wherein, M is at least one element selected from Sc, Y, La, Gd and Lu, and x and y are respective numbers of $0.03 < x < 0.3$ and $0.03 < y < 0.3$)

<blue phosphor>

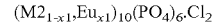

general formula 2

(wherein, M2 is at least one element selected from Mg, Ca, Sr and Ba, and x1 is a number satisfying $0 < x1 < 1$)

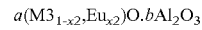

general formula 3

(wherein, M3 is at least one element selected from Mg, Ca, Sr, Ba, Zn, Li, Rb and Cs, x2 is a number satisfying $0 < x2 < 1$, and a and b are respective numbers satisfying $0 < a$, $0 < b$, and $0.2 \leq a/b \leq 1.5$)

<red phosphor>

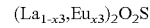

general formula 4

(wherein, x3 is a number satisfying $0.01 < x3 < 0.15$)

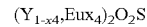

general formula 5

(wherein, x4 is a number satisfying $0.01 < x4 < 0.15$).

FIG. 1 shows a sectional view showing an example of the white LED of the embodiment. In FIG. 1, 1 denotes a light emitting diode, 2 denotes a phosphor layer which is buried in a resin, 3 denotes a reflection layer which leads the light emitted from the light emitting diode and the phosphors to outside, and 4 denotes a resin frame which supports a light emitting unit. It is configured such that electrical energy applied to the LED lamp through a wire 5 is converted into ultraviolet light or violet light by the light emitting diode, such light is converted into light having a longer wavelength by the phosphor layer which is on the light emitting diode, and in total, white light is externally emitted from the LED lamp.

For an ultraviolet light emitting diode or a violet light emitting diode, various diodes such as InGaN-base, GaN-base, and AlGaN-base diodes can be applied. Especially, when a light emitting diode has a peak value of an emission wavelength of 300 to 430 nm, a white LED having high level of brightness and more excellent color reproducibility can be realized by combining with phosphors described later. It is preferable when an ultraviolet light emitting diode or a violet light emitting diode has a peak value of an emission wavelength of 300 to 430 nm because higher brightness can be obtained when it is combined with the phosphors described later. And, an ultraviolet light emitting laser or a violet light emitting laser may be used instead of the ultraviolet light emitting diode or the violet light emitting diode. In this specification, the ultraviolet light emitting diode, the violet light emitting diode, the ultraviolet light emitting laser and the violet light emitting laser are collectively called as a light emitting element.

Figure 2:
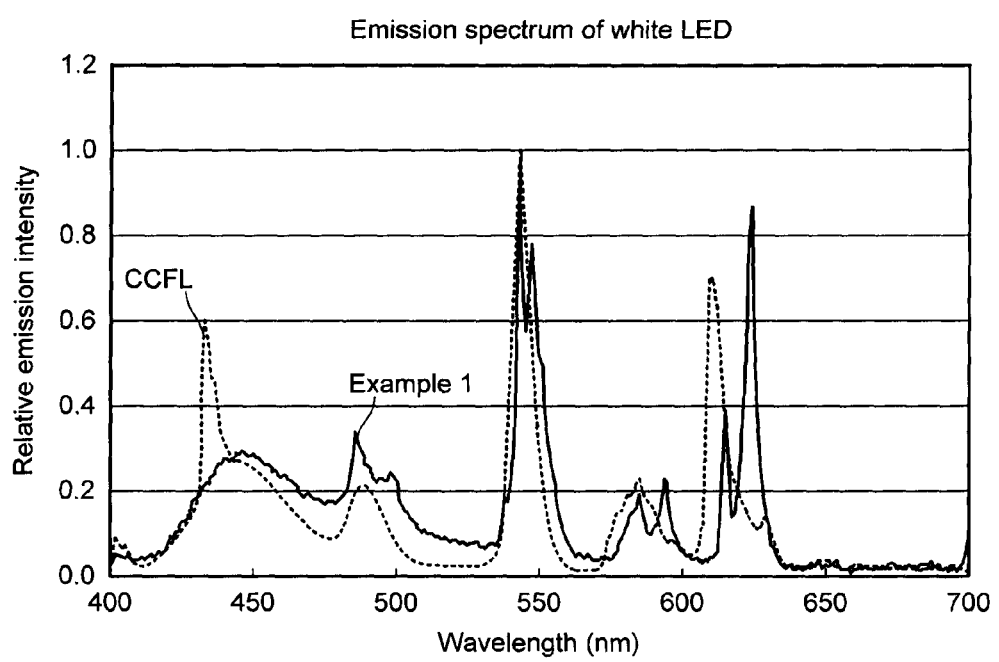
FIG. 2 is a diagram showing an example of the emission spectrum of the white LED of the embodiment.

The phosphor to be used for the phosphor layer 2 is not limited to a particular one if it is a phosphor capable of exhibiting the emission peaks given below when the white LED is formed, but it is important to use a visible light emitting phosphor. As the visible light emitting phosphor, it is preferable to use at least one or more of a green phosphor, a blue phosphor and a red phosphor. FIG. 2 shows an emission spectrum of one example (specifically, an emission spectrum of the white LED obtained by the following Example 1) of the white LED according to the embodiment together with the emission spectrum of a typical CCFL (using as a panel a liquid crystal panel manufactured by NEC LCD Technologies, Ltd.).

A first emission peak group comprises at least one emission peak having a maximum intensity in a range of 430 to 470 nm, a second emission peak group comprising at least one line emission peak having a maximum intensity in a range of 470 to 560 nm, and a third emission peak group comprising at least one line emission peak having a maximum intensity in a range of 600 to 650 nm.

According to the white LED of this embodiment, the emission peak wavelengths of the respective emission peak groups comprising the plural emission peaks appearing on the emission spectrum are specified as described above. In short, the respective emission peak groups are appropriate when they include the wavelength indicating the maximum intensity of the emission peak group in the above-described ranges, and it is not necessary to have all the emission peak groups in the above ranges.

For characteristics of the respective emission peak groups, the first emission peak group exhibits the emission peak having the maximum intensity in a range of 430 to 470 nm, and this wavelength is more preferably in a range of 430 to 460 nm, and the number of the emission peaks configuring the emission peak group may be plural and preferably be single. Here, the first emission peak group of the emission spectrum of the white LED of one example of the embodiment shown in FIG. 2 comprises one emission peak of which peak wavelength is 450 nm.

The second emission peak group exhibits the line emission peak having the maximum intensity in a range of 470 to 560 nm, and this wavelength is more preferably in a range of 480 to 560 nm. And, the number of the emission peaks configuring the emission peak group may be plural by combining the line emission peaks and peaks other than the line emission peaks, but it is preferably ten or less as a total of the both peaks. When the emission spectrum of FIG. 2 is checked, the second emission peak group comprises five line emission peaks, and their peak wavelengths are 547 nm (maximum intensity), 487, 495, 541 and 551 nm. The line emission peak in the specification denotes a emission peak having a full width at half maximum of 10 nm or less.

The third emission peak group exhibits the line emission peak having the maximum intensity in a range of 600 to 650 nm, and this wavelength is preferably in a range of 610 to 640 nm. The number of the emission peaks configuring the emission peak group may be plural by combining the line emission peaks and peaks other than the line emission peaks but preferably be two or less as a total of both peaks. In FIG. 2, the third emission peak group is comprised of two line emission peaks and their wavelengths are 624 nm (maximum intensity) and 615 nm.

If the white LED of this embodiment does not exhibit the respective emission peak groups in the above-described wavelength range, the same color as the color provided by the CCFL cannot be reproduced because a difference from the CCFL emission spectrum becomes large when it is used as the backlight of the liquid crystal display device.

Various types of phosphors usable for the white LED of this embodiment in order to exhibit the above-described emission peaks are described below. First, as the green phosphor, trivalent cerium- and terbium-activated rare earth borate phosphors substantially represented by the following general formula 1 can be preferably used. In the white LED of this embodiment, as the green phosphor, one or two types or more of the above-described phosphors can be used solely or as a mixture.

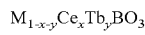  General formula 1

(wherein, M is at least one element selected from Sc, Y, La, Gd and Lu, and x and y are respective numbers of $0.03<x<0.3$ and $0.03<y<0.3$)

The element M is at least one element selected from Sc, Y, La, Gd and Lu. Since these elements are trivalent and have an ion radius of 0.07 to 0.11 nm, they are apt to have an $MBO_3$ structure. A crystal that emits light can be obtained by partly replacing the element M by Tb (terbium) and Ce (cerium).

And, as the element M, two or more may be selected from Sc, Y, La, Gd and Lu. For example, when it is assumed that the total amount of the element M is 100 (at) %, the Lu content is determined to be 1 at or more and less than 100 at %, and one or two or more elements the balance of Sc, Y, La and Gd can also be combined.

Upon replacement with $Ce^{3+}$ and $Tb^{3+}$, excitation light (300 to 430 nm) emitted from the light emitting element is first absorbed in $Ce^{3+}$ ions, and the absorbed energy is transferred to $Tb^{3+}$ ions, resulting in emission of green light. The value x and the value y showing the replacement level are $0.03<x<0.3$ and $0.03<y<0.3$, respectively. When x is 0.03 or less, energy is not sufficiently absorbed in $Ce^{3+}$, so that sufficient quantity of energy is not transferred to $Tb^{3+}$, and the emission of green light from $Tb^{3+}$ is not satisfactory. When x becomes 0.30 or more, luminous efficiency decreases conversely. Similarly, when y becomes 0.03 or less, the amount of $Tb^{3+}$ which receives energy transferred from $Ce^{3+}$ becomes insufficient, the green light emission is not sufficient, and when it becomes 0.3 or more, the luminous efficiency decreases.

The method of producing the green phosphor is not particularly limited, and for example, the following method may be mentioned. First, at least one of scandium oxide ($Sc_2O_3$), yttrium oxide ($Y_2O_3$), lanthanum oxide ($La_2O_3$), gadolinium oxide ($Gd_2O_3$) and lutetium oxide ($Lu_2O_3$) is weighed together with cerium oxide ($CeO_2$), terbium oxide ($Tb_4O_7$) and hydrogen borate ($H_3BO_3$) to obtain a predetermined amount so to have a composition represented by the general formula 1, and they are mixed sufficiently together with a sintering aid. The obtained raw material mixture is put in an alumina crucible or the like and fired at a temperature of about 1100 to 1400° C. for about 3 to 6 hours. Then, the obtained fired product is washed with pure water to remove unnecessary soluble components. Subsequently, it is filtered and dried to obtain a target green phosphor.

Now, the blue phosphor is described below. As the blue phosphor, the divalent europium-activated halophosphate phosphors substantially represented by the following general formula 2 and the divalent europium-activated aluminate phosphors substantially represented by the following general formula 3 can be preferably used. As the blue phosphor of the white LED of this embodiment, one type or two or more types selected from the phosphor group represented by the general formula 2 or the general formula 3 can be used alone or as a mixture. The mixture of two or more types may be a combination of two or more types selected from only one of the phosphor group represented by the general formula 2 or the phosphor group represented by the general formula 3, or may be a combination of two or more types selected from both of the phosphor group represented by the general formula 2 and the phosphor group represented by the general formula 3.

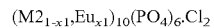  General formula 2

(wherein, M2 is at least one element selected from Mg, Ca, Sr and Ba, and x1 is a number satisfying $0<x1<1$)

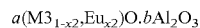  General formula 3

(wherein, M3 is at least one element selected from Mg, Ca, Sr, Ba, Zn, Li, Rb and Cs, x2 is a number satisfying $0<x2<1$, and a and b are respective numbers satisfying $0<a$, $0<b$, and $0.2 \leq a/b \leq 1.5$)

The element M2 in the general formula 2 denotes at least one element selected from the above elements, but the element M2 may be used by selecting two or more types from the above elements. The element M3 in the general formula 3 may be used by selecting two or more types in the same manner.

The method of producing the blue phosphor is not particularly limited, and the compound belonging to the general formula 2 or the general formula 3 produced by a general production method can be used for the white LED of this embodiment. And, it is also possible to use a commercially available product.

Finally, the red phosphor is described below. As the red phosphor, the europium-activated lanthanum oxysulfide phosphors represented by the following general formula 4 and the europium-activated yttrium oxysulfide phosphors represented by the general formula 5 can be preferably used. As the red phosphor in the white LED of this embodiment, one type or two or more types selected from the phosphor group represented by the general formula 4 or the general formula 5 can be used alone or as a mixture. The mixture of two or more types may be a combination of two or more types selected from only one of the phosphor group represented by the general formula 4 or the phosphor group represented by the general formula 5 or may be a combination of two or more types selected from both of the phosphor group represented by the general formula 4 and the phosphor group represented by the general formula 5.

$$(La_{1-x3}, Eu_{x3})_2O_2S \qquad \text{General formula 4}$$

(wherein, x3 is a number satisfying $0.01<x3<0.15$)

$$(Y_{1-x4}, Eu_{x4})_2O_2S \qquad \text{General formula 5}$$

(wherein, x4 is a number satisfying $0.01<x4<0.15$)

The method of producing the red phosphor is not particularly limited, and the compound belonging to the general formula 4 or the general formula 5 produced by a general production method can be used for the white LED of this embodiment. And, it is also possible to use a commercially available product.

For selection between the general formula 2 and the general formula 3 and between the general formula 4 and the general formula 5, it is preferable to select the phosphor according to an excitation wavelength, demand for brightness, chemical stability, cost and the like.

The white LED of this embodiment contains the above green phosphor, the blue phosphor and the red phosphor in the phosphor layer so as to exhibit the emission peak of the above-described characteristics in the emission spectrum.

The above-described green phosphor, blue phosphor and red phosphor receive an ultraviolet (or violet light) having a wavelength of 300 to 430 nm from the light emitting element of an ultraviolet light emitting diode or the like, absorb the ultraviolet light efficiently and emit the respective color lights at high efficiency. In other words, the green phosphor emits a highly bright green color light, the blue phosphor emits a highly bright blue color light, and the red phosphor emits a highly bright red color light. As a result, a highly bright white light can be provided. And, to obtain the white light, it is not preferable if a brightness difference is excessively large among the respective colors, for example, if only the green color light has a high brightness, because the white light becomes greenish. In other words, all color lights of green (G), blue (B) and red (R) are required to have a high brightness to obtain the white light with a high brightness, and the combination of the respective color phosphors is very important.

For example, the white LED of FIG. 1 is configured such that electrical energy applied to the light emitting diode 1 is converted into ultraviolet light (or violet light) by the light emitting diode, such light is converted to light having a longer wavelength by the phosphor layer which is on the light emitting diode, and in total, white light is externally emitted out of the LED. The emission spectrum, which is obtained by measuring the light emitted from the white LED of this embodiment by a spectrometer, is expressed in the form represented by, for example, FIG. 2.

In this specification, the ultraviolet light emitting diode or the violet light emitting diode used for the light emitting diode 1 is expressed as a light emitting diode, and the completed white light emitting diode is indicated as a white LED.

The emission peak, which appears in the emission spectrum of the white LED of this embodiment, appears at the above-described wavelength. For the intensity of each emission peak, when the intensity P1 of the maximum emission peak of the first emission peak group appearing in the range of 430 to 470 nm is determined to be 1, maximum intensity P2 of the second emission peak group is $3 \leq P2 \leq 5$, and maximum intensity P3 of the third emission peak group is $1 \leq P3 \leq 5$.

When the maximum intensities of the respective emission peak groups of the white LED of this embodiment are not in the above relationships, the same color as the color provided by the CCFL cannot be reproduced when the white LED is used as the backlight of the liquid crystal display device.

By adjusting as described above, the relationships between the wavelength at which the emission peak of the emission spectrum of the white LED of this embodiment is exhibited and the intensities of the respective emission peaks becomes the same as the optical characteristics of the CCFL.

The white LED of this embodiment can be produced by blending the above-described phosphors such as the green phosphor, the blue phosphor and the red phosphor at an appropriate blending ratio into the phosphor layer, such that the intensity ratio of emission peaks obtained as the emission spectrum falls in the above-described range.

Specifically, to obtain the above-described optical characteristics same as the optical characteristics of the CCFL by the white LED of this embodiment, there may be used and adjusted, as the green phosphor, at least one phosphor selected from trivalent cerium- and terbium-activated rare earth borate phosphors substantially represented by the above-described general formula 1, as the blue phosphor, at least one phosphor selected from divalent europium-activated halophosphate phosphors substantially represented by the above-described general formula 2 and divalent europium-activated aluminate phosphors substantially represented by the above-described general formula 3, and as the red phosphor, at least one phosphor selected from europium-activated lanthanum oxysulfide phosphors represented by the above-described general formula 4 and europium-activated yttrium oxysulfide phosphors represented by the above-described general formula 5, so that the contained amounts of the respective phosphors in the phosphor layer relative to the total amount of the phosphors become as follows: the green phosphor of 35 to 50% by weight, the blue phosphor of 50 to 70% by weight, and the red phosphor of 1 to 10% by weight.

For more preferable blending ratios of the respective phosphors, the green phosphor is 35 to 45% by weight, the blue phosphor is 50 to 60% by weight, and the red phosphor is 2 to 10% by weight. When the blending ratios of the respective phosphors are not in the above-described relationships in the white LED of this embodiment, the same color as the color provided by the CCFL cannot be reproduced by using it as the backlight for the liquid crystal display device.

And, it is also effective to increase the average particle diameter of the respective phosphors in order to improve the brightness furthermore. It is preferable that the average particle diameter is increased to 1 μm or more, and further to 10 μm or more. The method of increasing the average particle diameter includes a method of granulating one-color phosphors mutually, a method of granulating by mixing three-color phosphors, and the like. There are other methods such as a method using a sintering aid to produce the phosphor, a method for firing at a high temperature for a long period, and the like. The upper limit value of the average particle diameter is not particularly limited, and it is preferably 90% or less of the thickness of the phosphor layer of the white LED. If it is larger than the thickness of the phosphor layer, a problem that the phosphor particles are apt to drop when the phosphor layer is formed by fixing the phosphor particles with resin.

The method of producing the white LED is not particularly limited, and there are, for example, a method of producing a mixture phosphor by mixing respective color phosphor powders with respective resins and then mixing the mixture of respective color resins, and a method of producing a mixture phosphor by previously mixing respective color phosphor powders mutually, and then mixing with a resin. Here, the blending ratio of the resin and the phosphor is not limited if it is in a range that the phosphor acts efficiently when the white LED is formed, and in the phosphor layer as a whole, a total amount of the phosphors to be used relative to 100 parts by weight of the resin is preferably 30 to 80 parts by weight, and more preferably blended in 50 to 70 parts by weight. When the contained amount of the phosphor is less than 30 parts by weight relative to 100 parts by weight of the resin, the phosphors in the slurry might sediment, and if it exceeds 80 parts by weight, coating might become difficult.

The resin material used for the white LED of this embodiment is not particularly limited if it is a resin normally used for the white LED production, and it is preferably colorless and transparent and has a prescribed optical refractive index. It is preferable that the white LED of this embodiment has a transmission rate of 98 to 100%, and particularly 99 to 100%, (using a value obtained by measuring monochromatic light of 400 nm by using a test specimen having a thickness of 2 mm) and an optical refractive index of 1.3 to 1.7, and particularly 1.4 to 1.6. Here, when the optical refractive index is less than 1.3, it might become difficult to take light out of the light emitting diode element, and when it exceeds 1.7, it is not preferable because it might become difficult to take light out of the phosphor layer.

And, it is preferable that the resin material used for the white LED of this embodiment has sufficient durability against ultraviolet light used for excitation of the phosphor or under a thermal condition to which the resin material is exposed under production conditions or use conditions. In addition, its change in volume is preferably small under various conditions when it is exposed under the production conditions or the use conditions, or an adverse effect exerted due to the volume expansion is small. Use of such a soft resin material prevents effectively deformation of the resin frame 4 and (or) breakage of the wire 5.

As a particularly preferable resin material for the white LED of this embodiment satisfying the above conditions, there are, for example, silicone resins, epoxy resins and the like. Among them, the silicone resins, which are hardly discolored by ultraviolet light and have durability, are particularly preferable.

The completed mixture phosphor is coated on a light emitting diode, and the resin is hardened. Thus, the white LED can be formed. Structures of a substrate, a metallic frame (reflector) and the like used for the white LED are arbitrary.

The above-described white LED provides white light having a high level of brightness. This white LED is effective for a backlight, and particularly for the backlight of the liquid crystal display device.

Figure 3:
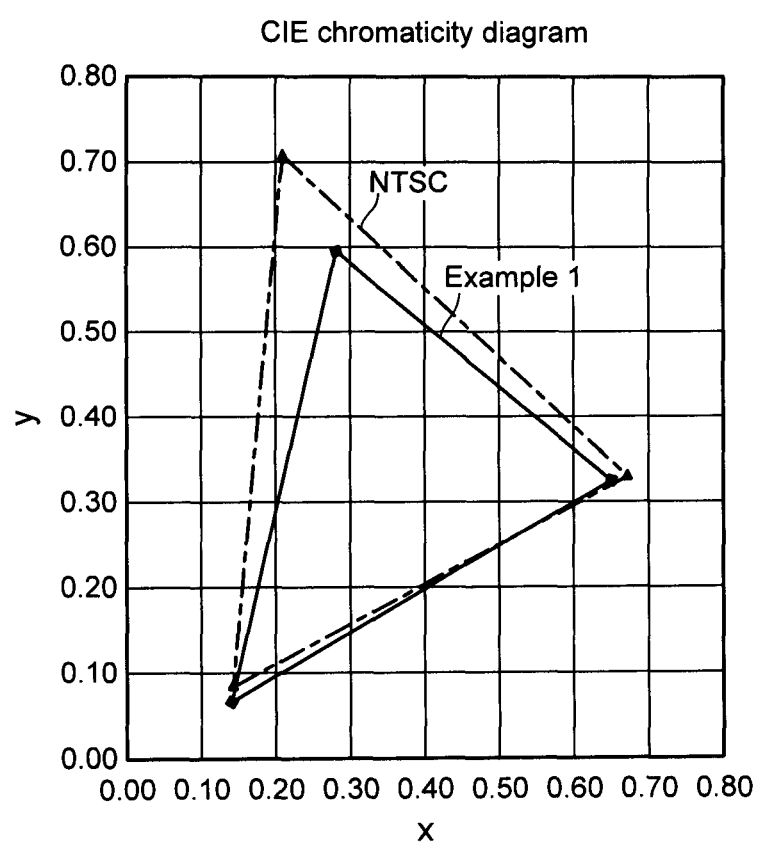
FIG. 3 is a diagram showing an example of color reproducibility when the white LED of the embodiment is used as a backlight of a liquid crystal display device.

FIG. 3 is a diagram showing a preferable example that the emitted light of the white LED (specifically, the white LED obtained by the following Example 1) of the white LED of this embodiment is passed through general color filters of blue, green and red used for the liquid crystal display device which has a conventional cold cathode fluorescent lamp (CCFL) as a backlight (specifically, using a liquid crystal display NL12876BC26 (manufactured by NEC LCD Technologies, Ltd.) using CCFL, which is replaced by the white LED obtained in the Example 1), and its emission colors are plotted on a CIE chromaticity diagram. This chromaticity diagram shows that the liquid crystal display device can express the light having chromaticity within a triangle obtained by connecting blue, green and red luminous points.

Figure 4:
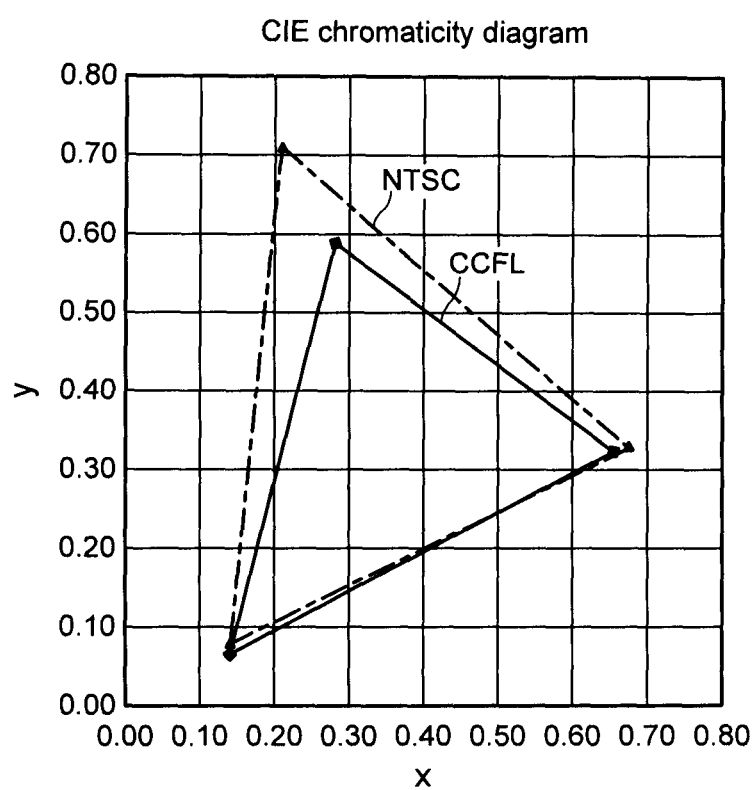
FIG. 4 is a diagram showing an example of color reproducibility when a conventional CCFL is used as a backlight of a liquid crystal display device.

When the triangle has a larger area, light with more chromaticities can be expressed, and its liquid crystal display device has a large color reproduction region (color reproducibility is good). FIG. 4 shows a color reproduction region of a typical liquid crystal display: NL12876BC26 (manufactured by NEC LCD Technologies, Ltd.) using a conventional cold cathode fluorescent lamp (CCFL), and it has substantially the same range as the color reproduction region of FIG. 3.

FIG. 3 and FIG. 4 also show color reproduction regions specified by an international standard, which is National Television Standards Committee (NTSC), showing ideal color reproduction regions. A size of the color reproduction region is indicated by a relative value with the triangle area of this NTSC determined as 100. Among the white LEDs of this embodiment exemplified here, the color reproduction region of the liquid crystal display device using a preferable white LED was 67, but the liquid crystal display device using a conventional CCFL had 65.

For the white LED of this embodiment obtained as described above, its emitted light was passed through general blue, green and red color filters which are used for a liquid crystal display device having a conventional cold cathode fluorescent lamp (CCFL) as a backlight. The emission colors were plotted on the CIE chromaticity diagram. Though somewhat variable depending on the used color filters, white chromaticity was roughly in a range of $0.26 \leq x \leq 0.36$ and $0.22 \leq y \leq 0.36$, and the respective blue, green and red luminous points are plotted to fall in the following ranges.

Blue luminous point (B): $0.13 \leq x \leq 0.15$ and $0.06 \leq y \leq 0.11$
Green luminous point (G): $0.28 \leq x \leq 0.30$ and $0.58 \leq y \leq 0.61$
Red luminous point (R): $0.63 \leq x \leq 0.66$ and $0.31 \leq y \leq 0.34$ The color reproduction region obtained by connecting the above B, G and R as corners of the triangle is same as the one shown in FIG. 3 and shows a size level of about 60 to 80 when it is determined that the triangle area of the NTSC is 100.

Thus, the white LED of this embodiment has color reproducibility same to or slightly higher than a conventional CCFL, so that a conventional color filter designed to be suitable for the CCFL can also be used, and the color reproducibility same to or higher than the conventional one can be obtained.

In addition, since the white LED of this embodiment can use the technology or knowledge used for the color filter for the conventional CCFL when it is desired to further improve the properties of the color filter, a target color filter can be obtained quite easily.

The white LED according to this embodiment and the backlight and liquid crystal display device using the same do not need to use mercury unlike the conventional CCFL and do not cause an environmental problem.

The backlight and liquid crystal display device using the above white LED are suitable for various liquid crystal display devices such as small screens of cellular phones, car navigation systems and mobile telecommunications equipment, middle- and large-size screens of personal computers and TVs, and the like. Especially, since the liquid crystal display device using the conventional CCFL has similar color reproducibility, it can be used without changing the designs of the color filter and the like. And, since the white LED has a high level of brightness, it can be applied to both of sidelight type and directly-under type backlights.

And, it is determined that a plurality of white LEDs are used to apply to the backlight, if necessary.

Comparative Examples 1 to 5

The same white LED as in Example 6 was prepared as the white LED of comparative examples except that the compositions of respective color phosphors were determined not to fall in the ranges of the compositions of the respective color phosphors of the white LED of this embodiment.

<Evaluation>

The white LEDs of the respective examples and comparative examples were measured for brightness. The brightness was measured by a method of measuring a total luminous flux, and specifically by emitting the respective white LEDs with a current of 40 mA, and using a 10-inch integrating sphere (DAS-2100) manufactured by Labshere, Inc. The results are shown in Table 2.

And, the white LEDs according to the respective examples and comparative examples were measured for the emission spectrum. The results on the wavelengths of the appeared emission peaks and the intensity ratios of the respective emission peaks are shown in Table 2. The line emission peaks were discriminated by affixing (1) to the back of the unit nm of the wavelength.

TABLE 1

| | Blue phosphor | | Green phosphor | | Red phosphor | | |
|---|---|---|---|---|---|---|---|
| | Compound | Blending ratio (% by weight) | Compound | Blending ratio (% by weight) | Compound | Blending ratio (% by weight) | Excitation wavelength of light emitting element (nm) |
| E1 | $(Sr_{0.97}Ca_{0.02}Eu_{0.01})_{10}(PO_4)_6 \cdot Cl_2$ | 50 | $Lu_{0.8}Ce_{0.1}Tb_{0.1}BO_3$ | 45 | $(La_{0.89}Eu_{0.11})_2O_2S$ | 5 | 370 |
| E2 | $(Sr_{0.97}Ca_{0.02}Eu_{0.01})_{10}(PO_4)_6 \cdot Cl_2$ | 53 | $Lu_{0.5}Y_{0.3}Ce_{0.1}Tb_{0.1}BO_3$ | 45 | $(La_{0.89}Eu_{0.11})_2O_2S$ | 2 | 370 |
| E3 | $(Sr_{0.99}Eu_{0.01})_{10}(PO_4)_6 \cdot Cl_2$ | 55 | $Lu_{0.9}Ce_{0.05}Tb_{0.05}BO_3$ | 35 | $(Y_{0.94}Eu_{0.06})_2O_2S$ | 10 | 370 |
| E4 | $2(Mg_{0.5}Ba_{0.375}Eu_{0.125})O \cdot 5Al_2O_3$ | 55 | $Lu_{0.7}Ce_{0.1}Tb_{0.2}BO_3$ | 43 | $(La_{0.89}Eu_{0.11})_2O_2S$ | 2 | 370 |
| E5 | $(Sr_{0.97}Ca_{0.02}Eu_{0.01})_{10}(PO_4)_6 \cdot Cl_2$ | 55 | $Sc_{0.8}Ce_{0.1}Tb_{0.1}BO_3$ | 40 | $(Y_{0.94}Eu_{0.06})_2O_2S$ | 5 | 320 |
| E6 | $(Sr_{0.97}Ca_{0.02}Eu_{0.01})_{10}(PO_4)_6 \cdot Cl_2$ | 60 | $Y_{0.8}Ce_{0.1}Tb_{0.1}BO_3$ | 35 | $(Y_{0.94}Eu_{0.06})_2O_2S$ | 5 | 400 |
| E7 | $(Sr_{0.75}Ba_{0.23}Ca_{0.01}Eu_{0.01})_{10}(PO_4)_6 \cdot Cl_2$ | 60 | $La_{0.8}Ce_{0.1}Tb_{0.1}BO_3$ | 35 | $(La_{0.89}Eu_{0.11})_2O_2S$ | 5 | 340 |
| E8 | $(Sr_{0.97}Ca_{0.02}Eu_{0.01})_{10}(PO_4)_6 \cdot Cl_2$ | 60 | $Gd_{0.8}Ce_{0.1}Tb_{0.1}BO_3$ | 35 | $(La_{0.89}Eu_{0.11})_2O_2S$ | 5 | 380 |
| CE1 | $(Sr_{0.97}Ca_{0.02}Eu_{0.01})_{10}(PO_4)_6 \cdot Cl_2$ | 60 | $La_{0.8}Ce_{0.1}Tb_{0.1}PO_4$ | 35 | $(La_{0.89}Eu_{0.11})_2O_2S$ | 5 | 360 |
| CE2 | $(Sr_{0.97}Ca_{0.02}Eu_{0.01})_{10}(PO_4)_6 \cdot Cl_2$ | 60 | $Lu_{0.5}Ce_{0.1}Tb_{0.4}BO_3$ | 35 | $(La_{0.89}Eu_{0.11})_2O_2S$ | 5 | 370 |
| CE3 | $(Sr_{0.97}Ca_{0.02}Eu_{0.01})_{10}(PO_4)_6 \cdot Cl_2$ | 60 | $Lu_{0.95}Ce_{0.02}Tb_{0.03}BO_3$ | 35 | $(La_{0.89}Eu_{0.11})_2O_2S$ | 5 | 370 |
| CE4 | $(Sr_{0.97}Ca_{0.02}Eu_{0.01})_{10}(PO_4)_6 \cdot Cl_2$ | 60 | $Lu_{0.8}Ce_{0.1}Tb_{0.1}BO_3$ | 35 | $(Y_{0.89}Eu_{0.11})_2O_3$ | 5 | 360 |
| CE5 | $CaWO_4$ | 60 | $Lu_{0.5}Y_{0.3}Ce_{0.1}Tb_{0.1}BO_3$ | 35 | $(La_{0.89}Eu_{0.11})_2O_2S$ | 5 | 370 |

E1 to E8 = Example 1 to Example 8
CE1 to CE5 = Comparative Example 1 to Comparative Example 5

EXAMPLES

Examples 1 to 8

For evaluation of the white LED according to this embodiment, the structure having the cross section of FIG. 1 was adopted. The white LEDs according to the respective examples were formed by arranging an ultraviolet light emitting diode having a size of 300 μm square as a light emitting element, mixing the respective phosphors (65 parts by weight of phosphors in total) having an average particle diameter of 5 μm and 35 parts by weight of a silicone resin to obtain a slurry, dripping the slurry onto the ultraviolet light emitting diode, and thermally treating at 100 to 150° C. to harden the silicone resin. The used silicone resin had an optical refractive index of 1.5 after hardening.

It was determined that the wavelength of the ultraviolet light emitting diode and the types and blending ratios (% by weight of the respective phosphors when the total amount of phosphors was determined to be 100%) of the respective phosphors are as shown in Table 1.

TABLE 2

| | Total luminous flux (lm) | Emission peak wavelength of emission spectrum (nm) | P2 | P3 |
|---|---|---|---|---|
| Example 1 | 1.12 | 450 nm, 487 nm(I), 495 nm(I), 541 nm(I), 547 nm(I), 551 nm(I), 615 nm(I), 624 nm(I) | 4.3 | 3.6 |
| Example 2 | 1.09 | 450 nm, 487 nm(I), 495 nm(I), 541 nm(I), 547 nm(I), 551 nm(I), 615 nm(I), 624 nm(I) | 4.0 | 1.5 |
| Example 3 | 1.02 | 450 nm, 487 nm(I), 495 nm(I), 541 nm(I), 547 nm(I), 551 nm(I), 618 nm(I), 627 nm(I) | 5.0 | 5.0 |
| Example 4 | 0.98 | 455 nm, 487 nm(I), 495 nm(I), 541 nm(I), 547 nm(I), 551 nm(I), 615 nm(I), 624 nm(I) | 3.8 | 1.0 |
| Example 5 | 0.52 | 450 nm, 487 nm(I), 495 nm(I), 541 nm(I), 547 nm(I), 551 nm(I), 618 nm(I), 627 nm(I) | 4.0 | 3.4 |
| Example 6 | 0.34 | 450 nm, 487 nm(I), 495 nm(I), 541 nm(I), 547 nm(I), 551 nm(I), 618 nm(I), 627 nm(I) | 3.0 | 3.1 |
| Example 7 | 0.32 | 450 nm, 487 nm(I), 495 nm(I), 541 nm(I), 547 nm(I), 551 nm(I), 615 nm(I), 624 nm(I) | 3.0 | 3.1 |
| Example 8 | 0.45 | 450 nm, 487 nm(I), 495 nm(I), 541 nm(I), 547 nm(I), 551 nm(I), 615 nm(I), 624 nm(I) | 3.0 | 3.1 |

TABLE 2-continued

| | Total luminous flux (lm) | Emission peak wavelength of emission spectrum (nm) | P2 | P3 |
|---|---|---|---|---|
| Comparative Example 1 | 0.05 | 450 nm, 487 nm(I), 495 nm(I), 541 nm(I), 547 nm(I), 551 nm(I), 615 nm(I), 624 nm(I) | 2.0 | 3.1 |
| Comparative Example 2 | 0.08 | 450 nm, 487 nm(I), 495 nm(I), 541 nm(I), 547 nm(I), 551 nm(I), 615 nm(I), 624 nm(I) | 2.1 | 3.1 |
| Comparative Example 3 | 0.12 | 450 nm, 487 nm(I), 495 nm(I), 541 nm(I), 547 nm(I), 551 nm(I), 615 nm(I), 624 nm(I) | 2.9 | 3.1 |
| Comparative Example 4 | 0.03 | 450 nm, 487 nm(I), 495 nm(I), 541 nm(I), 547 nm(I), 551 nm(I), 615 nm(I), 624 nm(I) | 1.9 | 3.1 |
| Comparative Example 5 | 0.02 | 430 nm, 487 nm(I), 495 nm(I), 541 nm(I), 547 nm(I), 551 nm(I), 615 nm(I), 624 nm(I) | 1.0 | 3.1 |

It was found as shown in Table 2 that the white LEDs of the above examples are provided with a high brightness. And, it is seen that the emission peaks in the emission spectrum are same as those of the emission spectrum of the CCFL shown in FIG. 2.

Examples 9 to 10

Then, the same white LED as in Example 2 was prepared and measured for the brightness in the same manner except that the average particle diameter of the phosphor was changed.

Specifically, Example 9 had an average particle diameter of 10 μm by firing each phosphor at a high temperature for a long period, and Example 10 had an average particle diameter of 15 μm by firing with a sintering aid used at a high temperature for a long period. The results are shown in Table 3.

TABLE 3

| | Total luminous flux (lm) |
|---|---|
| Example 9 | 1.25 |
| Example 10 | 1.48 |

It was found as shown in Table 3 that even when the same phosphor is used, the brightness becomes higher when the average particle diameter is larger. Even if the particle diameter of the phosphor is varied, the emission spectrum of the obtained white LED does not change.

Examples 11 to 20 and Comparative Examples 6 to 8

The white LEDs of Examples 1 to 10 and Comparative Examples 1 to 3 were used to configure backlights for the liquid crystal display devices by combining with general red (R), green (G) and blue (B) color filters used for the liquid crystal display devices having conventional cold cathode fluorescent lamps (CCFLs) as backlights (specifically, using liquid crystal displays NL12876BC26 (manufactured by NEC LCD Technologies, Ltd.) using the CCFLs, which are replaced by the white LEDs obtained in the examples).

Light passed through the color filters was guided to an integrating sphere to evaluate emission colors of red (R), green (G) and blue (B), and a color reproduction region (color reproducibility) of the obtained liquid crystal display device (display) was examined. For the color reproducibility, the CIE chromaticity diagram shown in FIG. 3 was used to measure coordinate of luminous points of green, blue and red. In addition, white chromaticity was determined. For comparison, the light emission coordinate of respective colors of the CCFL and the white chromaticity were also examined. The results are shown in Table 4.

TABLE 4

| | | Green | | Blue | | Red | | White | |
|---|---|---|---|---|---|---|---|---|---|
| Backlight | White LED | x | y | x | y | x | y | x | y |
| E11 | E1 | 0.283 | 0.589 | 0.140 | 0.070 | 0.650 | 0.321 | 0.292 | 0.311 |
| E12 | E2 | 0.284 | 0.588 | 0.140 | 0.070 | 0.650 | 0.321 | 0.280 | 0.305 |
| E13 | E3 | 0.284 | 0.587 | 0.140 | 0.070 | 0.660 | 0.318 | 0.311 | 0.305 |
| E14 | E4 | 0.283 | 0.588 | 0.143 | 0.100 | 0.650 | 0.321 | 0.282 | 0.299 |
| E15 | E5 | 0.282 | 0.589 | 0.140 | 0.070 | 0.660 | 0.318 | 0.288 | 0.297 |
| E16 | E6 | 0.283 | 0.587 | 0.140 | 0.070 | 0.660 | 0.318 | 0.270 | 0.285 |
| E17 | E7 | 0.283 | 0.587 | 0.140 | 0.070 | 0.650 | 0.321 | 0.270 | 0.220 |
| E18 | E8 | 0.283 | 0.588 | 0.140 | 0.070 | 0.650 | 0.321 | 0.270 | 0.231 |
| E19 | E9 | 0.284 | 0.587 | 0.140 | 0.070 | 0.650 | 0.321 | 0.272 | 0.289 |
| E20 | E10 | 0.283 | 0.588 | 0.140 | 0.070 | 0.650 | 0.321 | 0.274 | 0.292 |
| CE6 | CE1 | 0.282 | 0.586 | 0.140 | 0.070 | 0.650 | 0.321 | 0.240 | 0.200 |
| CE7 | CE2 | 0.283 | 0.589 | 0.140 | 0.070 | 0.650 | 0.321 | 0.205 | 0.170 |
| CE8 | CE3 | 0.282 | 0.589 | 0.140 | 0.070 | 0.650 | 0.321 | 0.200 | 0.160 |
| CCFL | — | 0.282 | 0.587 | 0.140 | 0.070 | 0.650 | 0.321 | 0.288 | 0.297 |

E = Example
CE = Comparative Example
(x, y) = CIE color coordinate

It was found as shown in Table 4 that chromaticity of blue, green and red filtered by the BGR color filters was not different between the examples and the comparative examples, but the chromaticity of white was almost same between the examples and the CCFL though it was deviated in the comparative examples from the coordinate value of the CCFL. That is, it can be said that the liquid crystal display device according to this embodiment is excellent in color reproducibility similar to the case that the conventional CCFL was used.

Incidentally, while certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and sprit of the inventions.

What is claimed is:

1. A white LED for a backlight of a liquid crystal display device, comprising at least one light emitting element selected from ultraviolet light emitting diodes, violet light emitting diodes, ultraviolet light emitting lasers and violet light emitting lasers, and a phosphor layer,
wherein an emission spectrum of the white LED includes:
a first emission peak group comprising at least one emission peak having a maximum intensity in a range of 430 to 470 nm;
a second emission peak group having at least one line emission peak having a maximum intensity in a range of 470 to 560 nm; and
a third emission peak group having at least one line emission peak having a maximum intensity in a range of 600 to 650 nm,
wherein, when maximum intensity P1 of the first emission peak group is determined to be 1,
maximum intensity P2 of the second emission peak group is $3 \leq P2 \leq 5$; and
maximum intensity P3 of the third emission peak group is $1 \leq P3 \leq 5$.

2. The white LED according to claim 1, wherein the first emission peak group is comprised of one emission peak having a maximum intensity in a range of 430 to 460 nm, the second emission peak group has 1 to 10 line emission peaks having a maximum intensity in a range of 480 to 560 nm, and the third emission peak group has 1 or 2 line emission peaks having a maximum intensity in a range of 610 to 640 nm.

3. The white LED according to claim 1, wherein the phosphor layer contains at least one green phosphor selected from trivalent cerium- and terbium-activated rare earth borate phosphors substantially represented by the following general formula 1:

   general formula 1:

(wherein, M is at least one element selected from Sc, Y, La, Gd and Lu, and x and y are respective numbers of $0.03 < x < 0.3$ and $0.03 < y < 0.3$).

4. The white LED according to claim 3, wherein the phosphor layer contains the green phosphor as particles of the green phosphor, and an average particle diameter of the green phosphor particles is 1 µm or more.

5. The white LED according to claim 1, wherein the phosphor layer contains at least one blue phosphor selected from divalent europium-activated halophosphate phosphors substantially represented by the following general formula 2 and divalent europium-activated aluminate phosphors substantially represented by the following general formula 3:

   general formula 2:

(wherein, M2 is at least one element selected from Mg, Ca, Sr and Ba, and x1 is a number satisfying $0 < x1 < 1$); and

   general formula 3:

(wherein, M3 is at least one element selected from Mg, Ca, Sr, Ba, Zn, Li, Rb and Cs, x2 is a number satisfying $0 < x2 < 1$, and a and b are respective numbers satisfying $0 < a$, $0 < b$, and $0.2 \leq a/b \leq 1.5$).

6. The white LED according to claim 5, wherein the phosphor layer contains the blue phosphor as particles of the blue phosphor, and an average particle diameter of the blue phosphor particles is 1 µm or more.

7. The white LED according to claim 1, wherein the phosphor layer contains at least one red phosphor selected from europium-activated lanthanum oxysulfide phosphors represented by the following general formula 4 and europium-activated yttrium oxysulfide phosphors represented by the following general formula 5:

   general formula 4:

(wherein, x3 is a number satisfying $0.01 < x3 < 0.15$); and

   general formula 5:

(wherein, x4 is a number satisfying $0.01 < x4 < 0.15$).

8. The white LED according to claim 7, wherein the phosphor layer contains the red phosphor as particles of the red phosphor, and an average particle diameter of the red phosphor particles is 1 µm or more.

9. The white LED according to claim 1, wherein the light emitting element has an emission wavelength of 300 to 430 nm.

10. A backlight using the white LED according to claim 1.

11. A liquid crystal display device using the backlight according to claim 10.

12. A white LED for a backlight of a liquid crystal display device, comprising at least one light emitting element selected from ultraviolet light emitting diodes, violet light emitting diodes, ultraviolet light emitting lasers and violet light emitting lasers, and a phosphor layer containing a green phosphor, a blue phosphor and a red phosphor,
wherein:
the green phosphor is at least one phosphor selected from trivalent cerium- and terbium-activated rare earth borate phosphors substantially represented by the following general formula 1;
the blue phosphor is at least one phosphor selected from divalent europium-activated halophosphate phosphors substantially represented by the following general formula 2 and divalent europium-activated aluminate phosphors substantially represented by the following general formula 3;
the red phosphor is at least one phosphor selected from europium-activated lanthanum oxysulfide phosphors represented by the following general formula 4 and europium-activated yttrium oxysulfide phosphors represented by the following general formula 5; and
the contained amounts of the respective color phosphors in the phosphor layer relative to the total amount of the phosphors are as follows: 35 to 50% by weight of the green phosphor, 50 to 70% by weight of the blue phosphor, and 1 to 10% by weight of the red phosphor:

<green phosphor>

   general formula 1:

(wherein, M is at least one element selected from Sc, Y, La, Gd and Lu, and x and y are respective numbers of $0.03 < x < 0.3$ and $0.03 < y < 0.3$)

<blue phosphor>

   general formula 2:

(wherein, M2 is at least one element selected from Mg, Ca, Sr and Ba, and x1 is a number satisfying $0<x1<1$)

$$a(M3_{1-x2},Eu_{x2})O \cdot bAl_2O_3 \qquad \text{general formula 3:}$$

(wherein, M3 is at least one element selected from Mg, Ca, Sr, Ba, Zn, Li, Rb and Cs, x2 is a number satisfying $0<x2<1$, and a and b are respective numbers satisfying $0<a$, $0<b$, and $0.2 \le a/b \le 1.5$)

<red phosphor>

$$(La_{1-x3},Eu_{x3})_2O_2S \qquad \text{general formula 4:}$$

(wherein, x3 is a number satisfying $0.01<x3<0.15$)

$$(Y_{1-x4},Eu_{x4})_2O_2S \qquad \text{general formula 5:}$$

(wherein, x4 is a number satisfying $0.01<x4<0.15$).

13. The white LED according to claim 12, wherein the contained amounts of the respective color phosphors in the phosphor layer relative to the total amount of the phosphors are: 35 to 45% by weight of the green phosphor, 50 to 60% by weight of the blue phosphor, and 2 to 10% by weight of the red phosphor.

14. The white LED according to claim 12, wherein the phosphor layer contains the green phosphor as particles of the green phosphor, the blue phosphor as particles of the blue phosphor and the red phosphor as particles of the red phosphor, and average particle diameters of the green phosphor particles, the blue phosphor particles and the red phosphor particles are 1 μm or more, respectively.

15. The white LED according to claim 12, wherein the light emitting element has an emission wavelength of 300 to 430 nm.

16. A backlight using the white LED according to claim 12.

17. A liquid crystal display device using the backlight according to claim 16.

18. The white LED according to claim 3, wherein a contained amount of the green phosphor in the phosphor layer relative to the total amount of the phosphors is 35 to 50% by weight.

19. The white LED according to claim 18, wherein the phosphor layer contains at least one blue phosphor selected from divalent europium-activated halophosphate phosphors substantially represented by the following general formula 2 and divalent europium-activated aluminate phosphors substantially represented by the following general formula 3, and a contained amounts of the blue phosphor in the phosphor layer relative to the total amount of the phosphors is 50 to 70% by weight:

$$(M2_{1-x1},Eu_{x1})_{10}(PO_4)_6 \cdot Cl_2 \qquad \text{general formula 2:}$$

(wherein, M2 is at least one element selected from Mg, Ca, Sr and Ba, and x1 is a number satisfying $0<x1<1$); and $$a(M3_{1-x2},Eu_{x2})O \cdot bAl_2O_3 \qquad \text{general formula 3:}$$

(wherein, M3 is at least one element selected from Mg, Ca, Sr, Ba, Zn, Li, Rb and Cs, x2 is a number satisfying $0<x2<1$, and a and b are respective numbers satisfying $0<a$, $0<b$, and $0.2 \le a/b \le 1.5$).

20. The white LED according to claim 19, wherein the phosphor layer contains at least one red phosphor selected from europium-activated lanthanum oxysulfide phosphors represented by the following general formula 4 and europium-activated yttrium oxysulfide phosphors represented by the following general formula 5, and a contained amounts of the red phosphor in the phosphor layer relative to the total amount of the phosphors is 1 to 10% by weight:

$$(La_{1-x3},Eu_{x3})_2O_2S \qquad \text{general formula 4:}$$

(wherein, x3 is a number satisfying $0.01<x3<0.15$); and $$(Y_{1-x4},Eu_{x4})_2O_2S \qquad \text{general formula 5:}$$

(wherein, x4 is a number satisfying $0.01<x4<0.15$).

* * * * *